United States Patent

Bartolini et al.

[11] 4,022,618
[45] May 10, 1977

[54] METHOD FOR DESENSITIZING RECORDED ORGANIC VOLUME PHASE HOLOGRAPHIC RECORDING MEDIA

[75] Inventors: Robert Alfred Bartolini, Trenton; William Joseph Burke, Princeton Junction; Allen Bloom, East Windsor, all of N.J.

[73] Assignee: RCA Corporation, New York, N.Y.

[22] Filed: Apr. 10, 1975

[21] Appl. No.: 566,706

[52] U.S. Cl. .................. 96/27 H; 204/159.16; 350/3.5
[51] Int. Cl.² ................................. G03C 5/04
[58] Field of Search ....... 96/27 H, 27 R, 67, 115 R; 350/3.5; 204/159.16

[56] References Cited
UNITED STATES PATENTS

| | | | |
|---|---|---|---|
| 3,526,505 | 9/1970 | Kroemer | 96/27 H |
| 3,885,964 | 5/1975 | Nacci | 96/115 R |
| 3,926,637 | 12/1975 | Bartolini et al. | 96/27 H |

*Primary Examiner*—Jack P. Brammer
*Attorney, Agent, or Firm*—Glenn H. Bruestle; Birgit E. Morris; Joseph T. Harcarik

[57] ABSTRACT

Organic volume phase holographic recording medium comprising an α-diketone in an acrylic polyester polymer is desensitized by exposing the medium to desensitizing light after recording is complete. This inactivates the α-diketone and prevents damage to the medium during readout.

6 Claims, 1 Drawing Figure

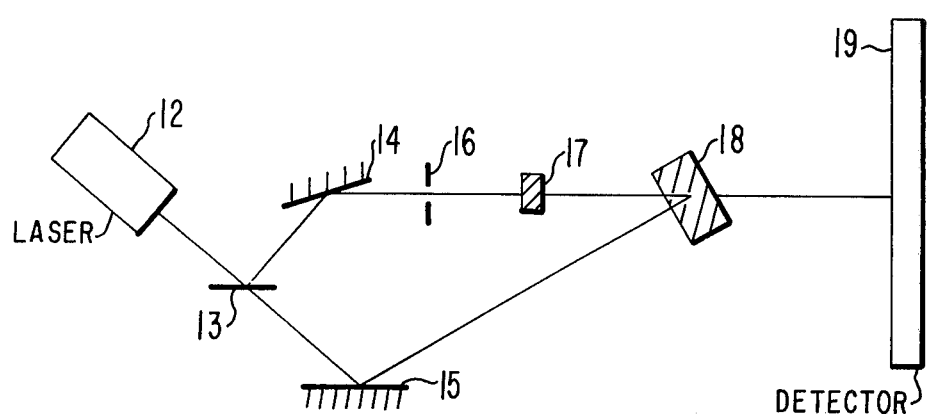

METHOD FOR DESENSITIZING RECORDED ORGANIC VOLUME PHASE HOLOGRAPHIC RECORDING MEDIA

This invention relates to a method for desensitizing volume phase holopraphic organic recording media. More particularly, this invention relates to a method for improving readout of permanent volume phase holograms in organic holographic recording media.

BACKGROUND OF THE INVENTION

In the U.S. Pat. No. 3,926,637 of Bartoline et al incorporated herein by reference, is disclosed organic volume phase holographic recording media which are useful to store holograms in permanent form. Such media comprise certain light sensitive α-diketones in an acrylic polyester resin, which α-diketones are capable of hydrogen atom abstraction with the polymer hosts during recording. Such reaction is irreversible and these media thus can be used as high density information storage media which are simple and relatively inexpensive to make.

One problem that has become apparent in the use of these recording media is that during readout, when a coherent light reference beam is passed through the medium, a certain amount of spurious light scattering occurs. This results in distortion of the readout image due to the interference of the readout beam with the different image beam. This light scattering cannot be erased because it is due to a continuing irreversible photochemical reaction in the medium. Thus a method ofpreventing further photochemical reaction in the recording medium after recording, particularly during readout, is highly desirable.

SUMMARY OF THE INVENTION

We have discovered that organic volume phase holographic storage media can be desensitized, preventing further photochemical reaction in the media after recording is complete, by flooding the media with light, either coherent light or incoherent light. Surprisingly, the holographic gratings stored and fixed in the recording media do not erase or decay during this process.

BRIEF DESCRIPTION OF THE DRAWING

The FIGURE is a schematic diagram of an apparatus suitable for recording volume phase holograms.

DETAILED DESCRIPTION OF THE INVENTION

The holographic storage media useful in the present process comprise α-diketones capable of hydrogen atom abstraction dissolved in an acrylic polyester precursor host which is then cured. These media are disclosed in application Ser. No. 403,408 filed Oct. 4, 1973 and now U.S. Pat. No. 3,926,637. Suitable α-diketones have the formula

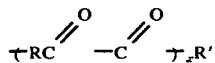

wherein R and R' independently can be methyl, a branched chain alkyl group or a cyclic hydrocarbon group wherein the carbon atoms are part of an aromatic or aliphatic ring, or R and R' together can form part of an aromatic or aliphatic ring; and $x$ is 1 or 2. Illustrative α-diketones include benzil, 1,3- or 1,4-bis(-phenylglyoxalyl)benzene, camphorquinone, 2,3-butanedione, 1-phenyl-1,2-propanedione and the like.

The host material is an acrylic polyester which is curable with free radical catalysts, such as Castolite liquid casting plastic AP resin commercially available from the Castolite Co. These polyesters cure to form transparent, hard castings.

During recording, a photochemical reaction occurs whereby the α-diketone abstracts a hydrogen atom from the host resin, resulting in a change in the index of refraction of the medium and permanently storing a holographic grating in the medium.

The FIGURE is a schematic diagram of a system useful for recording and readout of holographic information in the recording media described above. Referring now to the FIGURE, the system includes a laser 12 which emits a coherent light beam. The light beam passes through a beam splitter 13. A portion of the beam is reflected from the beam splitter 13 onto a first mirror 14; the rest of the light beam passes through onto a second mirror 15. The mirrors 14 and 15 are adjusted so that the plane polarized beams reflected from them meet at a predetermined angle, such as 30° or 45°. The portion of the beam reflected from the beam splitter 13 is the object beam. The object beam passes through a shutter 16 and through the object to be recorded 17. The portion of the beam which passes through the beam splitter 13 is the reference beam. The recording medium 18 is positioned at the intersection of the reference and object beams. During readout, the shutter 16 is closed and only the reference beam passes through to the recording medium. The image can be reviewed on a detector screen 19.

When more than one image is to be recorded in the recording medium, means for rotating or otherwise changing the selected portion of the recording medium exposed to the light beam is provided. During readout, means to rotate the recording medium or means to change the position or angle of the reference beam at the required angle of incidence will also be provided.

When all of the recording desired has been completed, the recording medium is flooded with light to inactivate the medium and to desensitize it to either further recording or readout light. Although the exact mechanism for this desensitization is not completely understood, it is believed the excess α-diketone that has not been reacted during the recording process is reacted photochemically. In the case where incoherent light is used for the desensitization, any source of strong light can be employed, such as a xenon arc, a mercury or a tungsten lamp. In the case where coherent light is used for the desensitization, an unmodulated beam having a wavelength which is absorbed by the α-diketone employed is provided.

The reaction is continued until the medium is insensitive to further exposure to light. This can be observed by monitoring the color of the medium, or by measuring the optical density at a particular wavelength characteristic of the α-diketone. Surprisingly, the uniform photochemical conversion does not erase, distort, or change the diffraction efficiency or otherwise affect the holographic gratings stored in the medium.

The invention will be further illustrated by the following examples but the invention is not limited to the details described therein.

EXAMPLE

Part A

One gram of camphorquinone was admixed with 20 grams of Castolite resin. Seven drops of Castolite hardener were added, when the mixture was stirred and placed in a vacuum dessicator for several minutes to remove any gas bubbles. The solution was poured into several thick molds and allowed to cure at room temperature for several days.

After removal from the molds, the castings were clear and hard and had a yellow color.

Part B

After polishing a casting obtained as in Part A, three holograms were recorded therein in an apparatus according to the FIGURE using a laser having a wavelength of 5145 angstroms. The diffraction efficiency of each hologram was about 30%.

The sample was then exposed to 100 milliwatts of unmodulated 5145 angstrom laser light for 1 hour.

The diffraction efficiency of the three recorded holograms was unchanged. No further holograms could be recorded in the sample.

Part C

After polishing a casting obtained as in Part A, five holograms were recorded using a 5145 angstrom wavelength laser. The diffraction efficiency of each hologram was 0.5%. The sample was then exposed to a flood of radiation from a 150 watt mercury lamp (wherein wavelengths below about 4000 angstroms and above about 7000 angstroms had been filtered out) for 10 hours. The diffraction efficiency of the 5 holograms was unchanged.

after exposure for an additional 5 hours, the sample, originally yellow, was colorless. The diffraction efficiency of the five holograms remained unchanged. No further holographic recordings could be made in this sample.

Part D

After polishing a casting obtained as in Part A, several holograms were recorded using a 5145 angstrom wavelength laser. The initial diffraction efficiency of one of the holograms was 43.5%. The optical density measured at 4750 angstroms wavelength light was about 1.2.

The casting was then exposed to a flood of radiation from a 150 watt xenon lamp through infrared and ultraviolet filters to remove wavelengths below about 4000 and above about 7000 angstroms, while monitoring the diffraction efficiency and optical density at intervals. The data are summarized below.

| Hours of Exposure | Diffraction Efficiency, % | Optical Density |
|---|---|---|
| initial | 43.5 | 1.2 |
| 0.5 | 42 | 0.6 |
| 1.5 | 43.5 | 0.25 |
| 3 | 41.5 | 0.15 |
| 4 | 43.5 | 0.10 |

After 4 hours, recording of a hologram using a 300 joules/cm² exposure at 0.744 watts /cm² was attempted. No hologram was recorded.

Part E

After polishing a casting obtained as in Part A, a hologram was recorded using a 5145 angstrom wavelength laser. The initaial diffraction efficiency was 15%.

The sample was then exposed to a flood of radiation from a 150 watt xenon lamp for 24 hours.

The casting had been bleached colorless. The holograms still had a diffraction efficiency of 15%.

We claim:

1. A method of desensitizing a holographic recording medium comprising a cured, transparent acrylic polyester polymer containing a soluble α-diketone which is capable of hydrogen atom abstraction and has the formula

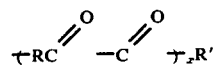

wherein R and R' independently are selected from the group consisting of methyl, branched chain alkyl and cyclic hydrocarbon groups wherein the carbon atoms are part of an aromatic or aliphatic ring and R and R' together can form part of an aromatic or aliphatic ring and $x$ is an integer of 1 or 2, said α-diketone being present in amounts sufficient to cause a permanent change in the index of refraction of the medium when illuminated by a spacially modulated coherent light beam having a wavelength corresponding to the absorption band wavelength tail of the α-diketone which comprises:

recording one or more holograms in said recording medium and thereafter exposing the complete recording medium to desensitizing light having a wavelength from about 4,000 to 7,000 angstroms until the medium is inactivated to light.

2. A method according to claim 1 wherein said desensitizing light is incoherent light.

3. A method according to claim 1 wherein said desensitizing light is an unmodulated coherent light beam having a wavelength which is absorbed by the α-diketone.

4. In the method for recording holograms which comprises changing the refractive index in the recording medium by exposing the recording medium comprising a cured, transparent acrylic polyester polymer containing an effective amount of a soluble α-diketone which is capable of hydrogen atom abstraction and has the formula

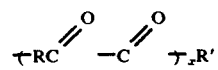

wherein R and R' independently are selected from the group consisting of methyl, branched chain alkyl and cyclic hudrocarbon groups wherein the carbon atoms are part of an aromatic or aliphatic ring and R and R' together can form part of an aromatic or aliphatic ring and $x$ is an integer of 1 or 2 with modulated light and detecting the refractive index changes, the improvement which comprises exposing the medium after recording one or more holograms therein to desensitizing light for a time sufficient to inactivate said medium prior to detection of the refractive index changes.

5. The method according to claim 4 wherein said desensitizing light is incoherent light.

6. The method according to claim 4 wherein said desensitizing light is coherent light having a wavelength which is absorbed by the α-diketone.

* * * * *